US012628290B2

(12) United States Patent
Zhao et al.

(10) Patent No.: US 12,628,290 B2
(45) Date of Patent: May 12, 2026

(54) SUPPORT ASSEMBLY AND DISPLAY DEVICE

(71) Applicant: KunShan Go-Visionox Opto-Electronics Co., Ltd, Kunshan (CN)

(72) Inventors: Yongfeng Zhao, Kunshan (CN); Liwei Ding, Kunshan (CN); Fu Liao, Kunshan (CN); Zhanshu Wang, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 188 days.

(21) Appl. No.: 18/503,252

(22) Filed: Nov. 7, 2023

(65) Prior Publication Data

US 2024/0074072 A1     Feb. 29, 2024

Related U.S. Application Data

(63) Continuation of application No. PCT/CN2022/135163, filed on Nov. 29, 2022.

(30) Foreign Application Priority Data

May 10, 2022    (CN) .......................... 202210508007.9
Sep. 30, 2022    (CN) .......................... 202211215762.4

(51) Int. Cl.
*H05K 5/02* (2006.01)
(52) U.S. Cl.
CPC ................................. *H05K 5/0217* (2013.01)

(58) Field of Classification Search
CPC ........ G06F 1/16; G06F 1/1641; G06F 1/1652; G06F 9/30; G06F 9/301; H05K 5/0217
See application file for complete search history.

(56) References Cited

U.S. PATENT DOCUMENTS 11,921,545 B2 *   3/2024   Feng ................... H04M 1/0268
12,177,994 B2 *   12/2024  Valeriy ............... H04M 1/0235
(Continued)

FOREIGN PATENT DOCUMENTS

CN       108064404 A      5/2018
CN       109727538 A      5/2019
(Continued)

OTHER PUBLICATIONS

Office Action issued on Oct. 28, 2024, in corresponding Chinese Application No. 202211215762.4, 13 pages.
(Continued)

*Primary Examiner* — Abhishek M Rathod
(74) *Attorney, Agent, or Firm* — Maier & Maier, PLLC

(57) ABSTRACT

A support assembly and a display device. The support assembly includes a body mechanism and a first support member. A first surface of the body mechanism is configured to support a part of the flexible screen. At least a part of the first support member is disposed side by side with the body mechanism, and configured to support another part of the flexible screen which extends out of the first surface. The first support member includes a first end and a second end disposed along a length direction of the first support member. The first end is fixed relative to the body mechanism, and the second end is configured to slide along a direction close to or away from the body mechanism.

17 Claims, 8 Drawing Sheets

(56) References Cited

U.S. PATENT DOCUMENTS

| | | | | |
|---|---|---|---|---|
| 2020/0152095 | A1 | 5/2020 | Lee et al. | |
| 2021/0304642 | A1 | 9/2021 | Lee et al. | |
| 2021/0366318 | A1* | 11/2021 | Feng | G09F 9/301 |
| 2021/0383727 | A1* | 12/2021 | Han | G06F 1/1656 |
| 2022/0342448 | A1* | 10/2022 | Shin | G06F 1/1624 |
| 2023/0004189 | A1* | 1/2023 | Luo | G06F 1/1652 |
| 2023/0041091 | A1* | 2/2023 | Park | H05K 5/0217 |
| 2023/0089831 | A1* | 3/2023 | Li | G06F 1/1601 |
| | | | | 361/679.01 |
| 2023/0095247 | A1* | 3/2023 | Feng | G06F 1/1624 |
| | | | | 361/679.27 |
| 2023/0244278 | A1* | 8/2023 | Yan | G06F 1/1637 |
| | | | | 361/679.01 |
| 2023/0324960 | A1* | 10/2023 | Hou | G06F 1/1624 |
| | | | | 361/679.01 |
| 2024/0015904 | A1* | 1/2024 | Choi | H04M 1/0268 |
| 2024/0040717 | A1* | 2/2024 | Zhang | G09F 9/301 |

FOREIGN PATENT DOCUMENTS

| | | | |
|---|---|---|---|
| CN | 209515060 | U | 10/2019 |
| CN | 110491289 | A | 11/2019 |
| CN | 111599278 | A | 8/2020 |
| CN | 111833748 | A | 10/2020 |
| CN | 112150930 | A | 12/2020 |
| CN | 112530286 | A | 3/2021 |
| CN | 212659253 | U | 3/2021 |
| CN | 112797277 | A | 5/2021 |
| CN | 113176808 | A | 7/2021 |
| CN | 113257132 | A | 8/2021 |
| CN | 113990201 | A | 1/2022 |
| CN | 114170914 | A | 3/2022 |
| CN | 114220350 | A | 3/2022 |
| KR | 1020190135585 | A | 12/2019 |
| KR | 1020200089743 | A | 7/2020 |

OTHER PUBLICATIONS

Extended Search Report issued on Oct. 9, 2024, in corresponding European Application No. 22941494.1, 9 pages.

International Search Report, issued Feb. 11, 2023, in corresponding International Application No. PCT/CN2022/135163, 20 pages.

Office Action issued on Dec. 16, 2024, in corresponding Korean Application No. 10-2023-7022262, 11 pages.

* cited by examiner

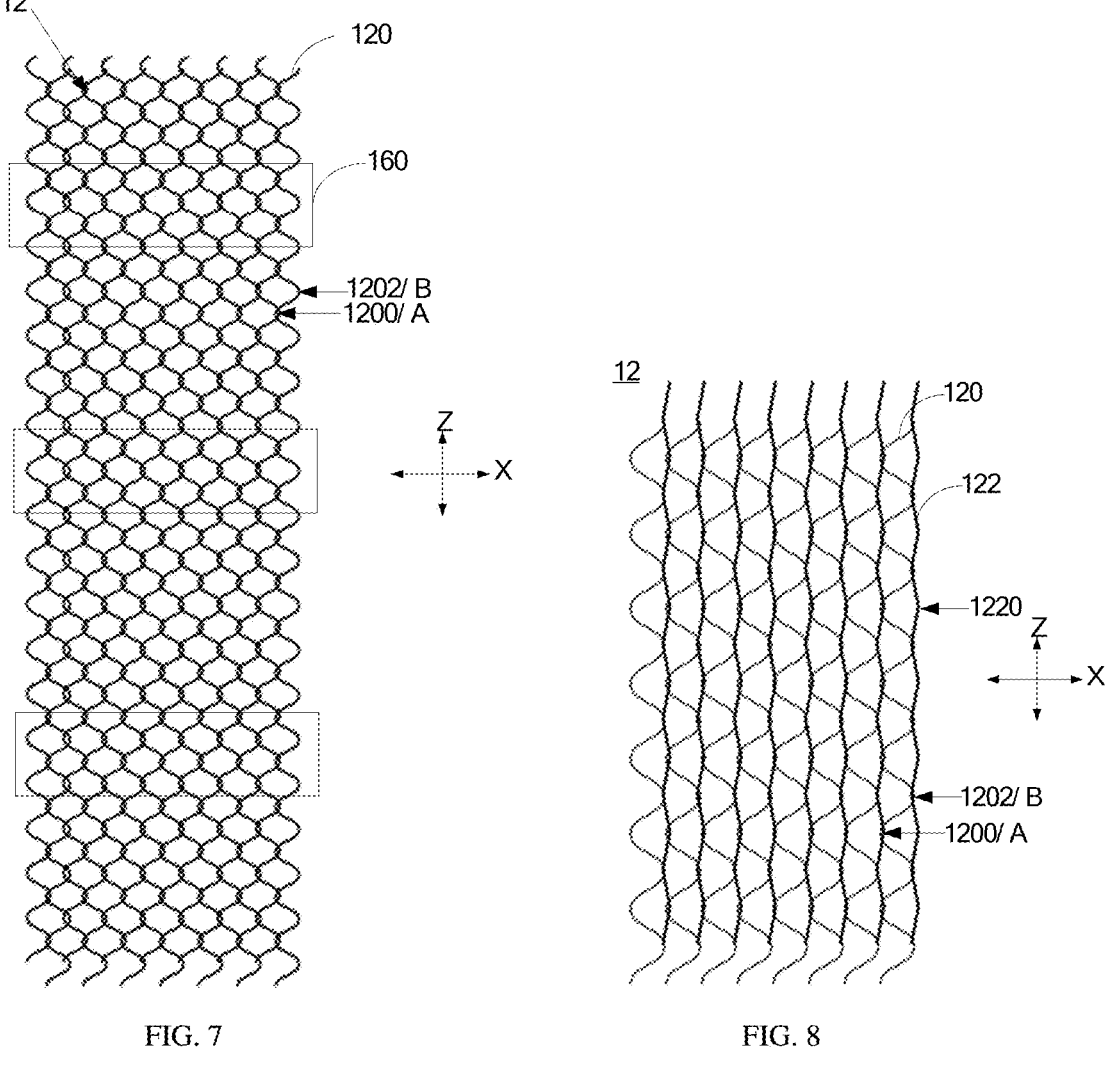
FIG. 7                                      FIG. 8

12    1204    120

12    120    160    124    126    124

16

16

SUPPORT ASSEMBLY AND DISPLAY DEVICE

The present application is a continuation of International (PCT) Patent Application No. PCT/CN2022/135163 filed on Nov. 29, 2022, which claims priorities to Chinese Patent Application No. 202210508007.9, entitled "SUPPORT ASSEMBLY AND DISPLAY DEVICE", filed on May 10, 2022, and Chinese Patent Application No. 202211215762.4, entitled "SUPPORT ASSEMBLY AND DISPLAY DEVICE", filed on Sep. 30, 2022, the contents of all of which are hereby incorporated by reference in their entirety.

FIELD

The present disclosure relates to the technical field of display, and in particular to a support assembly and a display device.

BACKGROUND

With the development of display technology, flexible screens appear. Sizes of the flexible screens may be adjusted according to display requirements, and it may minimize spaces occupied by the flexible screens during storage and carrying of the flexible screens.

At present, in order to improve the display effect of an unfolded flexible screen, a support assembly is generally disposed below the unfolded flexible screen. How to reduce a volume of the support assembly has become a research hotspot.

SUMMARY

A technical solution adopted in the present disclosure is to provide a support assembly that is configured to support a flexible screen. The support assembly includes a body mechanism and a first support member. A first surface of the body mechanism is configured to support a part of the flexible screen. At least a part of the first support member is located an outer side of the body mechanism, disposed side by side with the body mechanism, and configured to support another part of the flexible screen which extends out of the first surface. The first support member includes a first end and a second end disposed along a length direction of the first support member. The first end is fixed relative to the body mechanism, and the second end is configured to slide along a direction close to or away from the body mechanism. In a sliding direction, the first support member includes a plurality of flexible members disposed side by side, and two adjacent of the plurality of flexible members are connected to each other to form a netlike structure.

Another technical solution adopted in the present disclosure is to provide a display device. The display device includes a flexible screen and the support assembly described above, and the support assembly is configured to support the flexible screen.

BRIEF DESCRIPTION OF THE DRAWINGS

In order to more clearly illustrate the technical solutions in some embodiments of the present disclosure, hereinafter, a brief introduction will be given to the accompanying drawings that are used in the description of some embodiments. Obviously, the accompanying drawings in the description below are merely some embodiments of the present disclosure. For those of ordinary skill in the art, other accompanying drawings may be obtained based on these accompanying drawings without any creative efforts.

FIG. 7 is a partial schematic view of a first support member of FIG. 2 in some embodiments of the present disclosure.

FIG. 8 is a structural schematic view of the first support member of FIG. 2 in some embodiments of the present disclosure.

DETAILED DESCRIPTION

The technical solutions in some embodiments of the present disclosure may be clearly and completely described in conjunction with accompanying drawings in some embodiments of the present disclosure. Obviously, the described embodiments are only a part of the embodiments of the present disclosure, and not all embodiments. Based on the embodiments in the present disclosure, all other embodiments obtained by those of ordinary skill in the art without creative effort are within the scope of the present disclosure.

The present disclosure provides a support assembly and a display device. The support assembly may provide more effective support for an unfolded flexible screen, and reduce a volume of a first support member after rolling the first support member.

Figure 1:
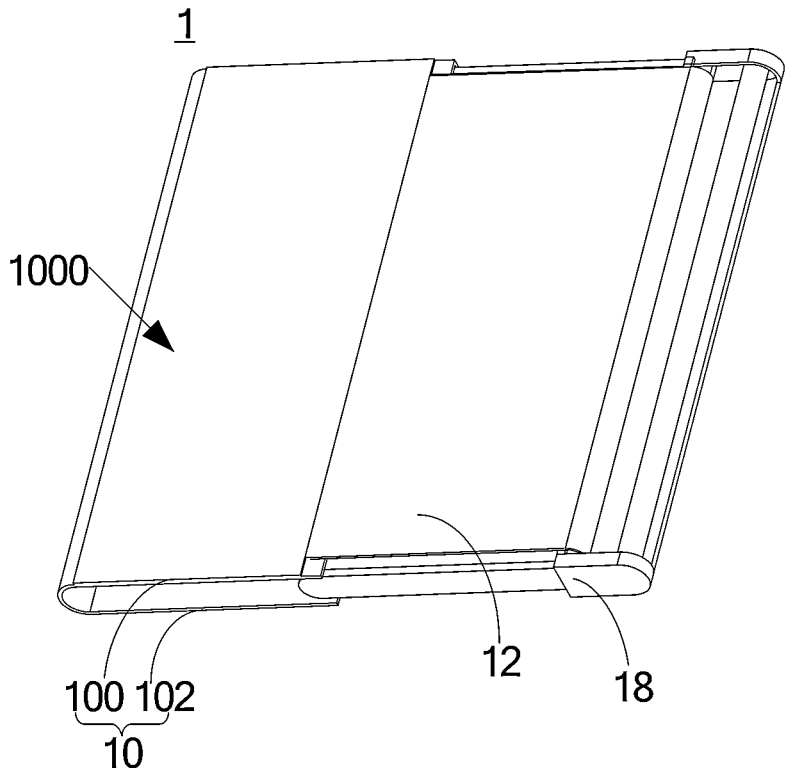
FIG. 1 is a structural schematic view of a support assembly in some embodiments of the present disclosure.
Figure 2:
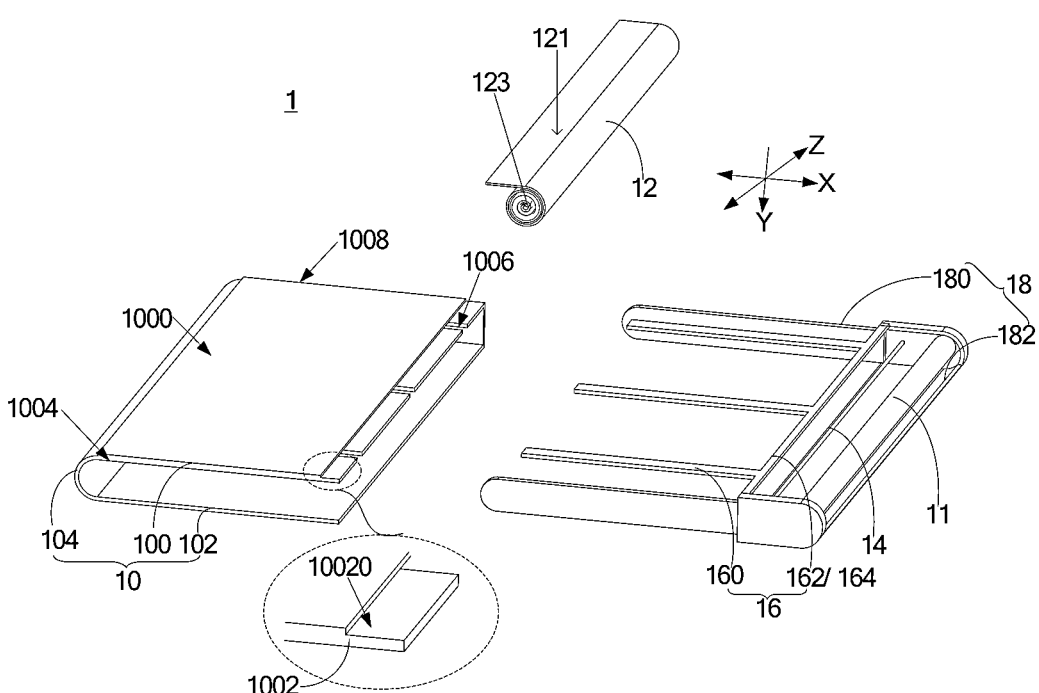
FIG. 2 is an exploded schematic view of the support assembly of FIG. 1 in some embodiments of the present disclosure.

Referring to FIGS. 1 and 2, FIG. 1 is a structural schematic view of a support assembly in some embodiments of the present disclosure, and FIG. 2 is an exploded schematic view of the support assembly of FIG. 1 in some embodiments of the present disclosure. A support assembly 1 is configured to support a flexible screen. The flexible screen may be a flexible OLED (Organic Light Emitting Diode) screen, a flexible Micro LED screen, or the like. The support assembly 1 includes a body mechanism 10 and a first support member 12.

In some embodiments, the body mechanism 10 includes a first surface 1000, and the first surface 1000 is configured to support a part of a flexible screen. In some embodiments, the first surface 1000 is also configured to fix the part of the flexible screen through an adhesive element or the like. At least a part of the first support member 12 is located on an outer side of the body mechanism 10 and arranged side by side with the body mechanism 10, to support the flexible screen extending out of the first surface 1000. The first support member 12 includes a first end 121 and a second end 123, and the first end 121 and the second end 123 are disposed along a length direction of the first support member 12. The first end 121 and the second end 123 respectively refer to two opposite ends along the length direction when the first support member 12 is fully unfolded. The first end 121 is fixed relative to the body mechanism 10, and the second end 123 may slide in a direction close to or away from the body mechanism 10, to change a size of a support surface formed by the first support member 12 and the body mechanism 10. As shown in FIG. 7, the first support member 12 includes multiple flexible members 120 disposed side by side in a sliding direction X, and adjacent flexible members 120 are connected to each other to form a netlike structure. This design mode may improve flexibility of the first support member 12 in the sliding direction X. In some embodiments, shapes of holes of the netlike structure may be approximated as a quadrilateral, such as a rhombus, etc.

In the above design mode, the first support member 12 is configured to support the flexible screen that extends out of the first surface 1000, thereby providing strong support for the flexible screen, especially when users touch the flexible screen. In the sliding direction X of the first support member 12, the first support member 12 includes multiple flexible members 120 arranged side by side or in parallel, and adjacent flexible members 120 are connected to each other to form the netlike structure. This design mode may improve the flexibility of the first support member 12 in the sliding direction X. During subsequent rolling of the flexible screen, the first support member 12 may be rolled with a smaller radius in the sliding direction, to reduce a volume occupied by the first support member 12, which facilitates to make the display device light and thin.

Referring to FIG. 2, the support assembly 1 provided in some embodiments of the present disclosure further includes a second support member 16. The second support member 16 has a certain degree of rigidity, and the flexibility of the second support member 16 is less than that of the first support member 12. The second support member 16 is stacked on a side of the first support member 12 away from the flexible screen 2 (as shown in FIG. 3) when the first support member 12 supports the flexible screen 2.

Figure 3:
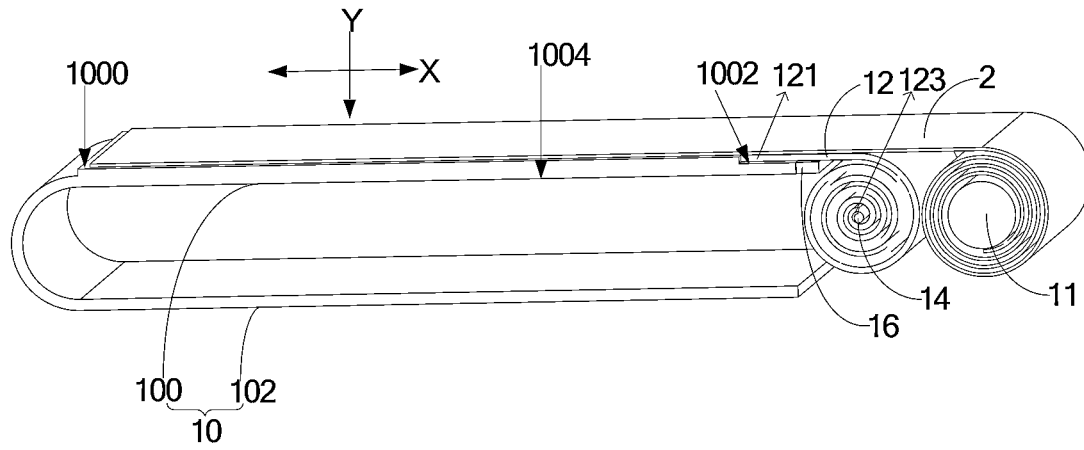
FIG. 3 is a structural schematic view illustrating a part of the support assembly of FIG. 1 and a flexible screen in some embodiments of the present disclosure.

In some embodiments, as shown in FIG. 3, FIG. 3 is a structural schematic view illustrating a part of the support assembly 1 of FIG. 1 and a flexible screen 2 in some embodiments of the present disclosure. The body mechanism 10 is configured to support the flexible screen 2 located on the first surface 1000 of the body mechanism 10. The remaining part of the flexible screen 2 located on the outer side of the body mechanism 10 is supported by the first support member 12 and the second support member 16 that are stacked on each other during unfolding the remaining part of the flexible screen 2. The first support member 12 with a certain degree of flexibility may better fit with or be better attached to the flexible screen 2, and the second support member 16 with a certain degree of rigidity may compensate for the strength of the first support member 12. The first support member 12 and the second support member 16 may provide strong support for the flexible screen 2, especially when the users touch the flexible screen 2.

In some embodiments, the second support member 16 is slidably connected to the body mechanism 10. A sliding direction X of the second end 123 relative to the body mechanism 10 is the same as a sliding direction X of the second support member 16 relative to the body mechanism 10. This design mode may allow the first support member 12 and the second support member 16 to synchronously translate, to provide synchronous support for an unfolded flexible screen 2, thereby achieving a better support effect.

In one embodiment, as shown in FIG. 3, the second end 123 and the second support member 16 simultaneously approach or move away from the body mechanism 10 along the sliding direction X. This design mode allows the support assembly 1 to have a relatively simple structure.

In some embodiments, referring to FIG. 2, the support assembly 1 provided in the present disclosure also includes a translation mechanism 18, and the translation mechanism 18 is slidably connected to the body mechanism 10. In the sliding direction X, the second support member 16 includes a fixed end 164, and the second end 123 of the first support member 12 and the fixed end 164 are fixed relative to the translation mechanism 18. In the above design mode, the translation mechanism 18 may synchronously drive the second support member 16 and the second end 123 to slide relative to the body mechanism 10, in order to reduce the difficulty of sliding the second support member 16 and the second end 123 relative to the body mechanism 10.

Referring to FIG. 3, the support assembly 1 provided in the present disclosure also includes a rolling shaft 14, and the rolling shaft 14 is configured to roll the first support member 12. One of the first end 121 and the second end 123 is fixedly connected to the rolling shaft 14. The rolling shaft 14 may make the process of rolling and unfolding the first support member 12 relatively simple.

In some embodiments, as shown in FIGS. 2 and 3, the rolling shaft 14 may approach or move away from the body mechanism 10 along the sliding direction X, driving the first support member 12 to roll or unfold. The rolling shaft 14 may be located on the outer side of the body mechanism 10. In some embodiments, the rolling shaft 14 may be disposed side by side with the body mechanism 10 in the sliding direction X where the rolling shaft 14 slides relative to the body mechanism 10. The first end 121 of the first support member 12 is fixedly disposed on the body mechanism 10, and the second end 123 of the first support member 12 is fixedly disposed on the rolling shaft 14. The rolling shaft 14 may drive the first support member 12 to roll or unfold. In some embodiments, the rolling shaft 14 approaches the body mechanism 10 along the sliding direction X, and the second end 123 also approaches the body mechanism 10 along the sliding direction X. A part of the first support member 12 is rolled on the rolling shaft 14, and an area of a support surface formed by the first support member 12 decreases. The rolling shaft 14 moves away from the body mechanism 10 along the sliding direction X, and the second end 123 also moves away from the body mechanism 10 along the sliding direction X because the second end 123 is fixedly disposed on the rolling shaft 14. The part of the first support member 12 rolled on the rolling shaft 14 is unfolded, and the area of the support surface formed by the first support member 12 increases. In the above design mode, the method of driving the first support member 12 to roll or unfold through the rolling shaft 14 is relatively simple, and the process of rolling or unfolding the first support member 12 is easier.

As shown in FIGS. 2 and 3, in the sliding direction X, an edge of the first surface 1000 of the body mechanism 10 is adjacent to the first support member 12, and the edge of the first surface 1000 of the body mechanism 10 is provided with a step part 1002. The first end 121 of the first support member 12 is located on the step part 1002 and fixedly connected to the step part 1002. This design mode may reduce the difficulty of fixing the first support member 12 with the body mechanism 10, which facilitates to reduce the thickness of the support assembly 1.

In some embodiments, the first end 121 of the first support member 12 may be fixedly connected to the step part 1002 through the adhesive element or the like.

In some embodiments, the body mechanism 10 includes a first plate body 100. The first plate body 100 includes the first surface 1000 and a second surface 1004 opposite to the first surface 1000. The first plate body 100 includes the step part 1002. In a first direction Y that is directed from the first surface 1000 to the second surface 1004, a thickness of the first support member 12 is the same as a height of the step part 1002. This design mode may allow a side of the unfolded first support member 12 facing the flexible screen 2 to be flush with the first surface 1000, so as to make the unfolded flexible screen 2 more flat and improve the display effect.

Figure 4:
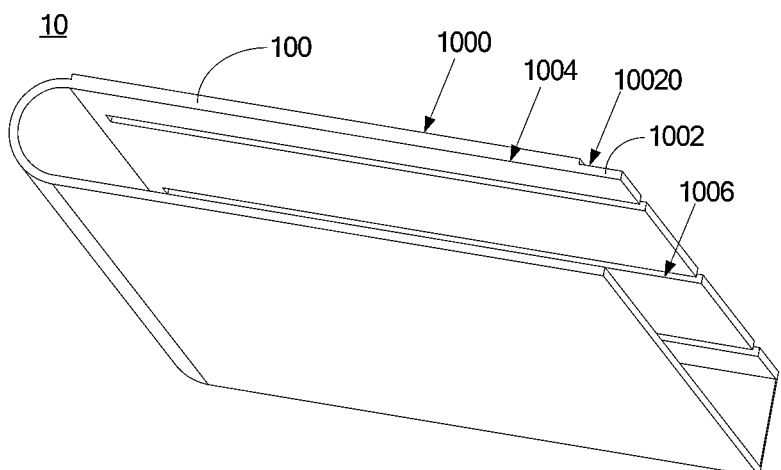
FIG. 4 is a structural schematic view of a body mechanism of FIG. 1 from another perspective.

Referring to FIGS. 2 and 4, FIG. 4 is a structural schematic view of a body mechanism 10 of FIG. 1 from another perspective. The body mechanism 10 further defines an accommodate groove 1006. At least a part of the second support member 16 is located in the accommodate groove 1006 and is slidably connected to the accommodate groove 1006. That is, the accommodate groove 1006 may play a certain guiding role in the sliding of the second support member 16. In some embodiments, an extending direction of the accommodate groove 1006 is parallel to the sliding direction X, so that a direction of unfolding the second support member 16 is the same as a direction of unfolding the first support member 12. The second support member 16 and the first support member 12 may synchronously support the flexible screen 2.

In some embodiments, both the step part 1002 and the accommodate groove 1006 may be located on the first plate body 100, and the accommodate groove 1006 is located on a side of the second surface 1004. The structural design of the body mechanism 10 is relatively simple.

In some embodiments, as shown in FIGS. 2 and 4, in the first direction Y that is directed from the first surface 1000 to the second surface 1004, the step part 1002 includes a bottom 10020, and the bottom 10020 includes a hollow area. The accommodate groove 1006 extends to the hollow area, and a side of the second support member 16 facing the first support member 12 is flush with the bottom 10020. This design mode may allow the second support member 16 to be in direct contact with the first support member 12, and the joint support formed by the second support member 16 and the first support member 12 may better support the flexible screen 2.

In some embodiments, as shown in FIG. 2, a second direction Z is perpendicular to the sliding direction X and the first direction Y. In the second direction Z, a width of the body mechanism 10 is greater than a width of the second support member 16, and a width of the accommodate groove 1006 may be equal to the width of the second support member 16 slidable in the accommodate groove 1006. This design mode may allow only a part of the bottom 10020 of the step part 1002 to be passed through or penetrated by the accommodate groove 1006, and the remaining part of the bottom 10020 that is not passed through or penetrated by the accommodate groove 1006 may be fixedly connected to the first support member 12, to ensure the fixing effect between the first support member 12 and the step part 1002.

In some embodiments, referring to FIGS. 1 and 2, the support assembly 1 provided in the present disclosure further includes the translation mechanism 18, and the translation mechanism 18 is slidably connected to the body mechanism 10. In the sliding direction X where the rolling shaft 14 slides relative to the body mechanism 10, the second support member 16 includes the fixed end 164, the rolling shaft 14 and the fixed end 164 are fixedly connected to the translation mechanism 18, and the rolling shaft 14 is located on the side of the fixed end 164 away from the body mechanism 10. In the above design mode, the translation mechanism 18 may synchronously drive the second support member 16 and the rolling shaft 14 to slide relative to the body mechanism 10, in order to reduce the difficulty of sliding the second support member 16 and the rolling shaft 14 relative to the body mechanism 10.

In some embodiments, in the direction perpendicular to the first surface 1000 (i.e. the first direction Y), the body mechanism 10 further includes a second plate body 102 that is opposite to and spaced apart from the first plate body 100. The translation mechanism 18 includes at least one extension plate body 180. The extension plate body 180 is located between the first plate body 100 and the second plate body 102, and the extension plate body 180 is slidably connected to the first plate body 100 and the second plate body 102. In some embodiments, each of the first plate body 100 and the second plate body 102 defines a guide groove at a position corresponding to the extension plate body 180. An extending direction of the guide groove is parallel to the sliding direction X. Two opposite sides of the extension plate body 180 in the first direction Y are respectively arranged in one guide groove at a corresponding position. The sliding connection mode between the body mechanism 10 and the translation mechanism 18 is relatively simple.

In some embodiments, as shown in FIG. 2, in the second direction Z, the translation mechanism 18 includes two extension plate bodies 180 that are opposite to and spaced apart from each other. The first plate body 100 includes two first edges 1008 that are opposite to and spaced apart from each other. Each of the extension plate bodies 180 is provided at a position of a corresponding one of the first edges 1008.

In some embodiments, the fixed end 164 of the second support member 16 and two opposite ends of the rolling shaft 14 in the second direction Z may be fixedly connected to the two extension plate bodies 180, respectively.

In some embodiments, the translation mechanism 18 may further include a first connecting plate body 182 that connects two extension plate bodies 180. The first connecting plate body 182 is located on a side of each of the extension plate bodies 180 away from the body mechanism 10. In some embodiments, the body mechanism 10 further includes a second connecting plate body 104 that connects the first plate body 100 and the second plate body 102. The second connecting plate body 104 is located on a side of the first plate body 100 away from the translation mechanism 18.

Figure 5:
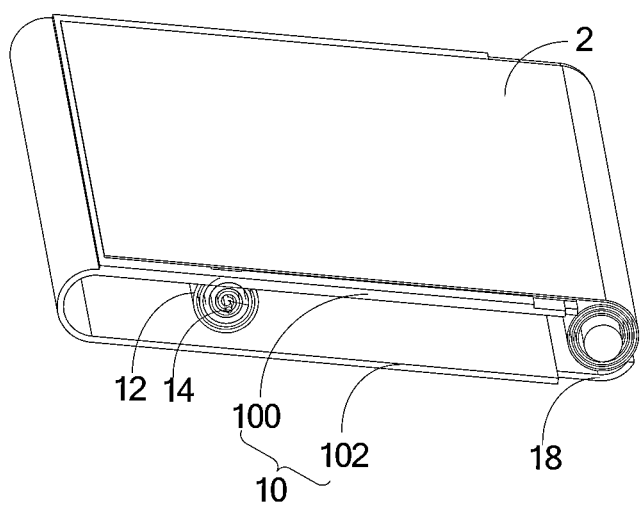
FIG. 5 is a structural schematic view illustrating a support assembly and a flexible screen in some embodiments of the present disclosure.
Figure 6:
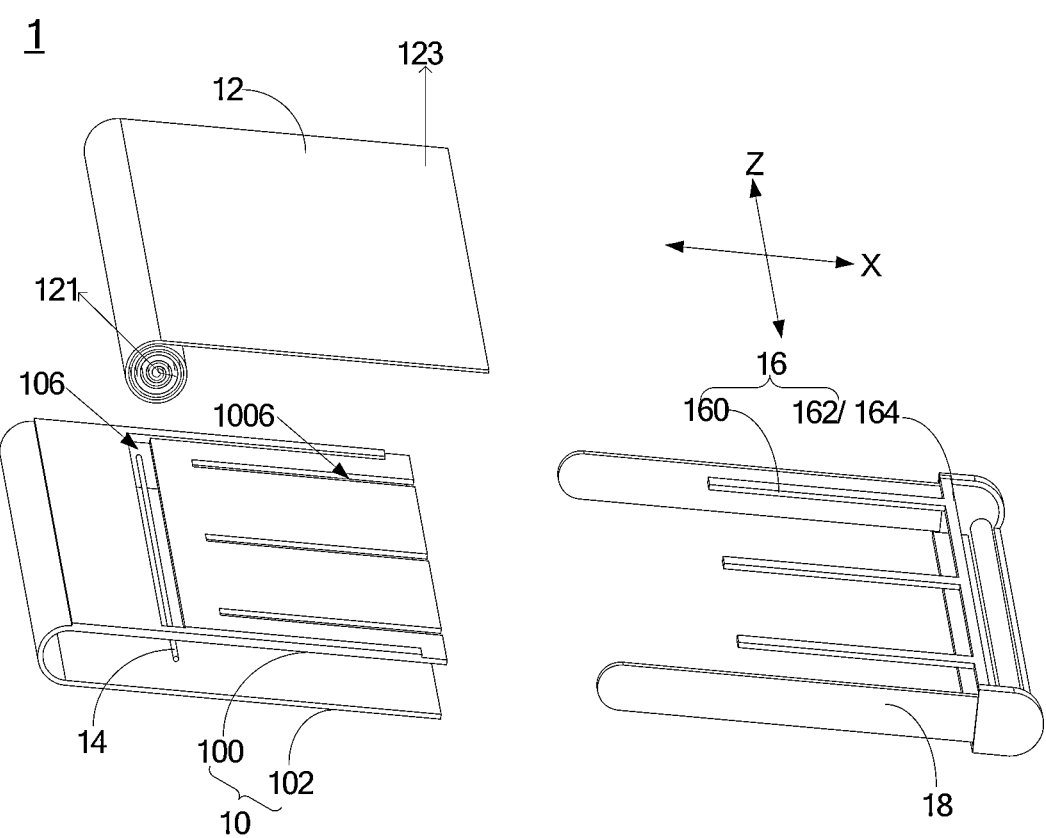
FIG. 6 is an exploded schematic view of the support assembly of FIG. 5.

In some embodiments, the rolling shaft 14 is located on the outer side of the body mechanism 10, and the rolling shaft 14 may approach or move away from the body mechanism 10. In some embodiments, the rolling shaft 14 may also be fixed relative to the body mechanism 10. In some embodiments, referring to FIGS. 5-6, FIG. 5 is a structural schematic view illustrating a support assembly 1 and a flexible screen 2 in some embodiments of the present disclosure. FIG. 6 is an exploded schematic view of the support assembly of FIG. 5. In some embodiments, the support assembly 1 of FIGS. 5-6 is different from the support assembly 1 of FIG. 2 in that: the first end 121 of the first support member 12 is fixedly disposed on the rolling shaft 14, the rolling shaft 14 is fixed relative to the body mechanism 10, and the second end 123 of the first support member 12 is configured to approach or move away from the body mechanism 10 along the sliding direction X. In some embodiments, the second end 123 of the first support member 12 is fixedly connected to the translation mechanism 18, and the fixed end 164 of the second support member 16 is located on a side away from the body mechanism 10. The rolling shaft 14 may slide in a direction close to or away from the translation mechanism 18 to drive the first support member 12 to roll or unfold. The sliding direction X of the translation mechanism 18 relative to the body mechanism 10 is the same as the sliding direction X of the second support member 16 relative to the body mechanism 10. In some embodiments, since the rolling shaft 14 is fixed relative to the body mechanism 10, the rolling shaft 14 slides in the direction close to or away from the translation mechanism 18, that is, the body mechanism 10 slides in the direction close to or away from the translation mechanism 18. In other words, the translation mechanism 18 slides in the direction close to or away from the body mechanism 10. In case that the translation mechanism 18 approaches the body mechanism 10 or the rolling shaft 14 along the sliding direction X, the second end 123 also approaches the body mechanism 10 or the rolling shaft 14 along the sliding direction X, and the rolling shaft 14 drives the first support member 12 to roll. In case that the translation mechanism 18 moves away from the body mechanism 10 or the rolling shaft 14 along the sliding direction X, the second end 123 also moves away from the body mechanism 10 or the rolling shaft 14 along the sliding direction X, and the rolling shaft 14 drives the first support member 12 to unfold. This design mode may allow the support assembly 1 to have a relatively simple structure, and this design mode may provide better smoothness and feel. The first support member 12 and the second support member 16 have a larger support area for the flexible screen 2.

In some embodiments, as shown in FIGS. 5 and 6, the rolling shaft 14 is located on an inner side of the body mechanism 10, and the body mechanism 10 includes a hollow part 106. The first end 121 of the first support member 12 passes through the hollow part 106 and is fixedly connected to the rolling shaft 14. This structural design mode is relatively simple.

In some embodiments, as shown in FIGS. 5 and 6, the body mechanism 10 includes the first plate body 100 and the second plate body 102 that are opposite to and spaced apart from each other. The rolling shaft 14 is located between the first plate body 100 and the second plate body 102. A side of the first plate body 100 away from the second plate body 102 is configured to support the flexible screen 2 (as shown in FIG. 5). The first plate body 100 is provided with the hollow part 106. The structural of the body mechanism 10 with the hollow part 106 is relatively simple.

In some embodiments, the first plate body 100 is provided with the accommodate groove 1006 that is slidably connected to the second support member 16. The specific structure of the accommodate groove 1006 is described in the above embodiments and will not be further described here. The second support member 16 includes the fixed end 164 fixed to the translation mechanism 18. In the sliding direction X, the hollow part 106 is farther away from the fixed end 164 than the accommodate groove 1006.

In some embodiments, a length extending direction of the accommodate groove 1006 is parallel to the sliding direction X, and a length extending direction of the hollow part 106 is parallel to the second direction Z. And/or, one end of the first support member 12 may be fixedly connected to the fixed end 164 of the second support member 16. This design mode may allow the first support member 12 and the second support member 16 to synchronously support the unfolded flexible screen 2.

Referring to FIG. 7, FIG. 7 is a partial schematic view of a first support member 12 of FIG. 2 in some embodiments of the present disclosure. The flexibility of the first support member 12 in the sliding direction X is greater than the flexibility of the first support member 12 in the second direction Z. The above design mode with greater flexibility in the sliding direction X may reduce the difficulty of rolling the first support member 12 through the rolling shaft 14, and may also allow the first support member 12 to be rolled with a very small radius. The above design mode with less flexibility in the second direction Z may allow the first support member 12 to have a certain degree of rigidity in the second direction Z when unfolding the first support member 12, thereby improving the support effect.

In some embodiments, in the second direction Z, each of the flexible members 120 extends in a spiral-shape structure. This design mode may allow the flexible members 120 to have a certain degree of rigidity in the second direction Z. In some embodiments, a wire diameter of each of the flexible members 120 is in a range from 0.05 mm to 1 mm (such as 0.06 mm, 0.07 mm, 0.08 mm, 0.09 mm, etc.). The outer diameter of the spiral-shape structure formed by each of the flexible members 120 is in a range from 0.05 mm to 3 mm (such as 0.1 mm, 0.5 mm, 1 mm, 1.5 mm, 2 mm, 2.5 mm, etc.). This design mode may reduce the thickness and rolling radius of the final formed first support member 12.

In some embodiments, in the sliding direction X, adjacent flexible members 120 are misaligned and intersect with each other to form the netlike structure. The structural design of the flexible members 120 is relatively simple, and adjacent flexible members 120 may be connected to each other without an additional connecting member.

In some embodiments, as shown in FIG. 7, each of the flexible members 120 includes convex parts 1200 and concave parts 1202 that are alternately disposed. A top end A of each convex part 1200 of each of the flexible members 120 intersects with a bottom end B of the corresponding one of the concave parts 1202 of an adjacent one of the flexible members 120. The above mode of forming the first support member 12 is relatively simple and easy to implement.

In other embodiments, the first support member 12 may also be formed by other structural design modes. In some embodiments, referring to FIG. 8, FIG. 8 is a structural schematic view of the first support member 12 of FIG. 2 in some embodiments of the present disclosure. The first support member 12 includes multiple connecting members 122 and multiple flexible members 120. The connecting members 122 are arranged side by side or in parallel with the flexible members 120 in the sliding direction X. Two adjacent of the flexible members 120 are connected by a corresponding one of the connecting members 122. This structural design of the first support member 12 is relatively simple and easy to implement.

In some embodiments, as shown in FIG. 8, in the sliding direction X, all flexible members 120 are aligned with each other. Each of the flexible members 120 includes convex parts 1200 and concave parts 1202 that are alternately disposed. The top A of each convex part 1200 of one of two adjacent flexible members 120 intersects with the connecting member 122 located between the two adjacent flexible members 120. The bottom end B of each concave part 1202 of the other of two adjacent flexible members 120 intersects with the connecting member 122 located between the two adjacent flexible members 120. The structural design of the first support member 12 is relatively simple and easy to implement.

In some embodiments, each of the connecting members 122 may be a zigzag shape, and each of the connecting members 122 includes corner points 1220 spaced apart from each other. The position where each flexible member 120 intersects with the corresponding one of the connecting members 122 is located at a corresponding one of the corner points 1220.

Figure 9:
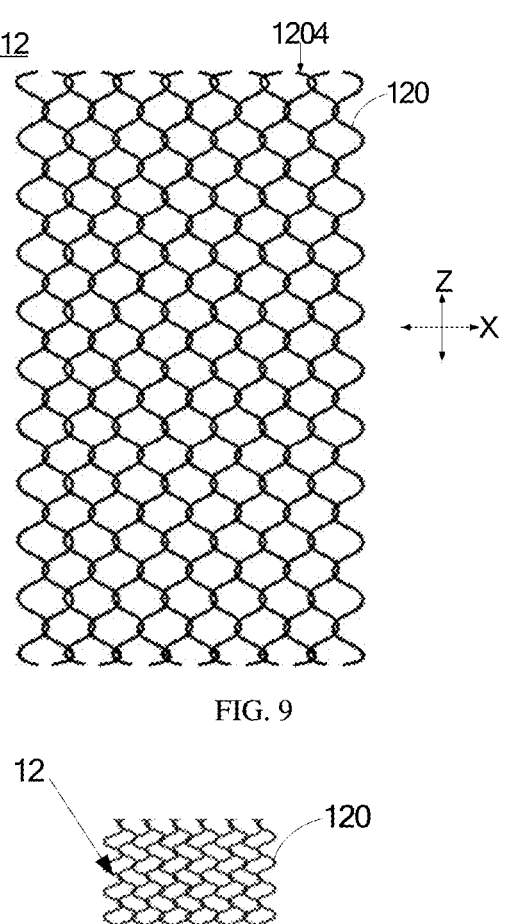
FIG. 9 is a structural schematic view of the first support member of FIG. 2 in some embodiments of the present disclosure.

In some embodiments, referring to FIG. 9, FIG. 9 is a structural schematic view of the first support member 12 of FIG. 2 in some embodiments of the present disclosure. Multiple ends 1204 of adjacent flexible members 120 intersect with each other. This design mode may reduce the misalignment of the first support member 12 in the second direction Z during rolling or unfolding. In some embodiments, the ends 1204 of the adjacent flexible members 120 may be flush and connected with each other to form a fixedly locking structure, further reducing the probability of the first support member 12 being misaligned in the second direction Z during rolling or unfolding.

In some embodiments, as shown in FIG. 2, the second support member 16 includes multiple support strips 160 and a connecting strip 162. The multiple support strips 160 are arranged side by side in the second direction Z, and each support strip 160 may extend along the sliding direction X. The connecting strip 162 extends along the second direction Z and is fixedly connected to each support strip 160. This design mode may reduce usage cost of the second support member 16.

In some embodiments, as shown in FIGS. 2 and 7, due to the certain rigidity of the first support member 12 in the second direction Z, the multiple support strips 160 may be configured to support at intervals. That is, the multiple support strips 160 are spaced apart from each other. The support strips 160 extending along the sliding direction X may compensate for the rigidity of the first support member 12 in the sliding direction X, so that the joint support effect of the support strip 160 and the first support member 12 is better.

In some embodiments, the connecting strip 162 is fixedly connected to an end of each of the support strips 160 away from the body mechanism 10. This structural design is relatively simple. In some embodiments, the number of the connecting strips 162 may also be multiple, and the second support member 16 may also form the netlike structure. In some embodiments, the connecting strip 162 farthest away from the body mechanism 10 forms the fixed end 164.

In some embodiments, as shown in FIGS. 2 and 4, the body mechanism 10 defines multiple accommodate grooves 1006 with the same extending direction. Each support strip 160 is located in a corresponding one of the accommodate grooves 1006, and slidably connected to the corresponding one of the accommodate grooves 1006. This structural design is relatively simple and may ensure that the sliding direction X of each support strip 160 remains the same.

In some embodiments, the second support member 16 is a magnet, and the first support member 12 may be attracted by the magnet. In some embodiments, a material of the first support member 12 may be stainless steel, etc. This design mode may allow the unfolded first support member 12 to be tightly attached to the second support member 16 to further improve the support effect.

Figure 10:
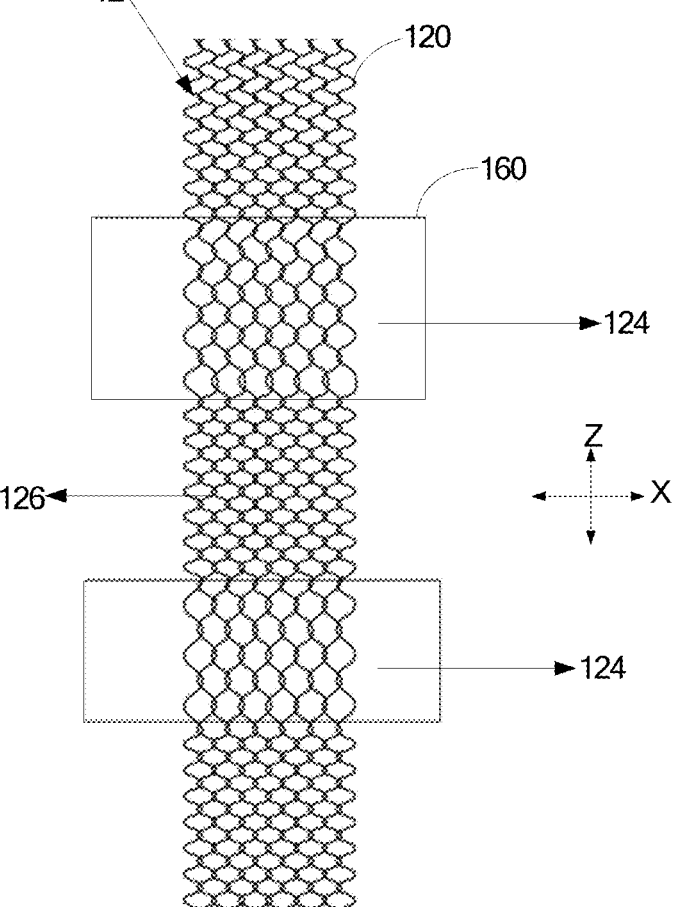
FIG. 10 is a partial schematic view illustrating the first support member and a second support member of FIG. 2 in some embodiments of the present disclosure.

In some embodiments, referring to FIG. 10, FIG. 10 is a partial schematic view illustrating the first support member 12 and a second support member 16 of FIG. 2 in some embodiments of the present disclosure. When the first support member 12 and the second support member 16 are unfolded, the first support member 12 includes a first part 124 and a second part 126 that are alternately disposed. An orthogonal projection of the first part 124 on the second support member 16 overlaps with or coincides with the support strips 160. An orthogonal projection of the second part 126 on the second support member 16 is staggered with the support strips 160. An aperture diameter of the netlike structure of the first part 124 is greater than an aperture diameter of the netlike structure of the second part 126. Generally speaking, the smaller the aperture diameter of the netlike structure, the larger the density of a support mesh of the first support member 12, the better the support performance, but the smaller the rolling performance. In the above design mode, in the second direction Z, the netlike structure of the first support member 12 has a density change. A part ((i.e. the first part 124) of the first support member 12 corresponding to or facing the second support member 16 has relatively sparse holes, and accordingly the support performance of the first part 124 of the first support member 12 becomes weaker. Due to the support compensation provided by the second support member 16, the support performance of the entire support assembly 1 corresponding to the second support member 16 is not weakened. On the contrary, it may improve the overall rolling performance of the first support member 12.

In some embodiments, referring to FIG. 2 or FIG. 6, each of the support strips 160 in the second support member 16 is a linear and non-retractable structure. In some embodiments, each of the support strips 160 may also be in a retractable form to reduce a volume occupied by each of the support strips 160. In some embodiments, each of the support strips 160 includes multiple support parts that are slidably connected in sequence, and one of the multiple support parts is fixedly connected to the translation mechanism 18. This design mode may reduce a volume occupied by the second support member 16.

Figure 11:
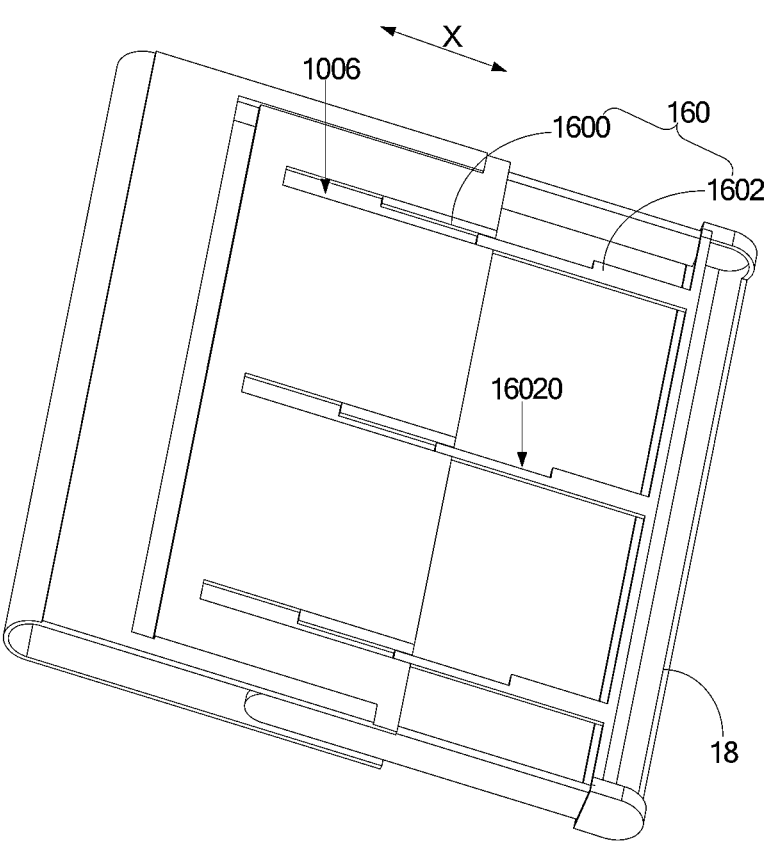
FIG. 11 is a structural schematic view of the support assembly in some embodiments of the present disclosure.

In some embodiments, outer surfaces of two adjacent of the support parts located on the same support strip 160 are slidably connected to each other. In some embodiments, as shown in FIG. 11, FIG. 11 is a structural schematic view of the support assembly 1 in some embodiments of the present disclosure. Each of the support strips 160 includes a first support part 1600 and a second support part 1602. The outer surface of the first support part 1600 is slidably connected to the outer surface of the second support part 1602, and the second support part 1602 is fixedly connected to the translation mechanism 18. During unfolding, the second support part 1602 first slides along the sliding direction X with the translation mechanism 18. When the second support part 1602 slides to the end of the stroke relative to the first support part 1600, the second support part 1602 then drives the first support part 1600 to slide out of the corresponding one of the accommodate grooves 1006.

In some embodiments, an extending length of the second support part 1602 in the sliding direction X is the same as an extending length of the corresponding one of the accommodate grooves 1006 in the sliding direction X. An extending length of the first support part 1600 in the sliding direction X is less than or equal to the extending length of the corresponding one of the accommodate grooves 1006 in the sliding direction X. When the extending length of the first support part 1600 in the sliding direction X is less than the extending length of the corresponding one of the accommodate grooves 1006, as shown in FIG. 11, the second support part 1602 defines a groove 16020, and the groove 16020 is configured to accommodate the first support part 1600 and is slidably connected to the first support part 1600.

Figure 12:
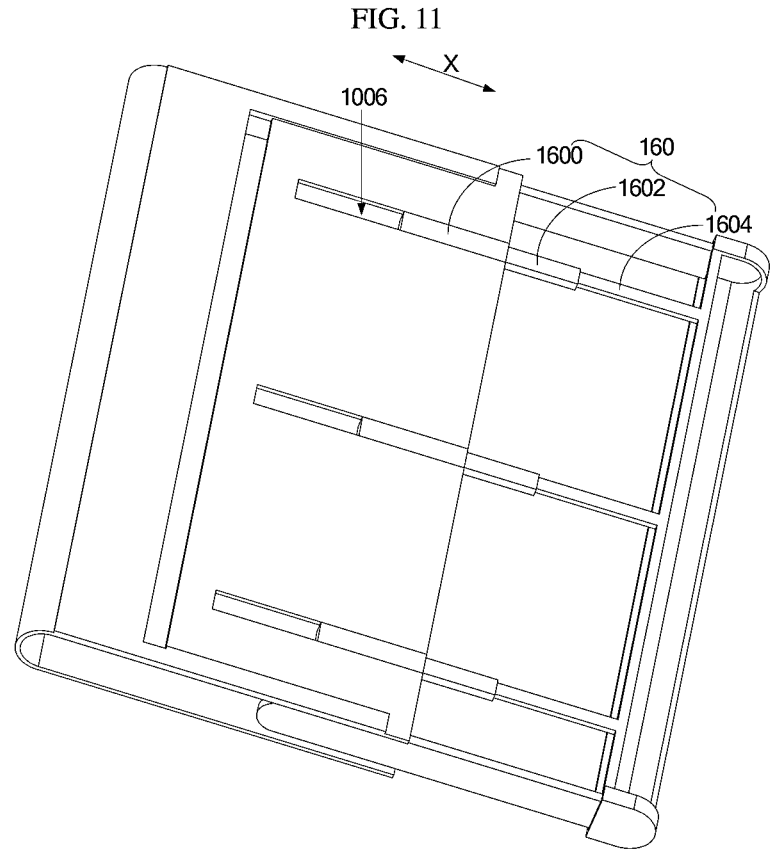
FIG. 12 is a structural schematic view of the support assembly in some embodiments of the present disclosure.

In some embodiments, one of two adjacent support parts located on the same support strip 160 defines an accommodate space, and an outer surface of the other of the two adjacent support parts located on the same support strip 160 is slidably connected to an inner surface of the accommodate space. In some embodiments, the extending length of each support part in the sliding direction X is the same as the extending length of the corresponding one of the accommodate grooves 1006. In some embodiments, referring to FIG. 12, FIG. 12 is a structural schematic view of the support assembly 1 in some embodiments of the present disclosure. The support strip 160 includes the first support part 1600, the second support part 1602, and a third support part 1604 that are slidably connected to each other. The third support part 1604 is fixedly connected to the translation mechanism 18. An outer surface of the second support part 1602 is slidably connected to the inner surface of the accommodate space of the first support part 1600, and an outer surface of the third support part 1604 is slidably connected to the inner surface of the accommodate space of the second support part 1602.

Figure 13:
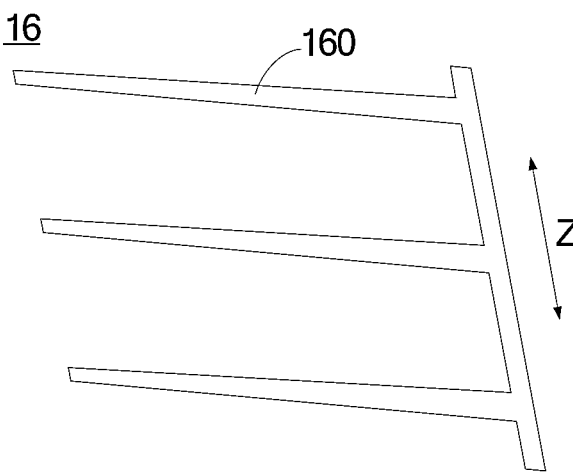
FIG. 13 is a structural schematic view of the second support member of FIG. 2 in some embodiments of the present disclosure.
Figure 14:
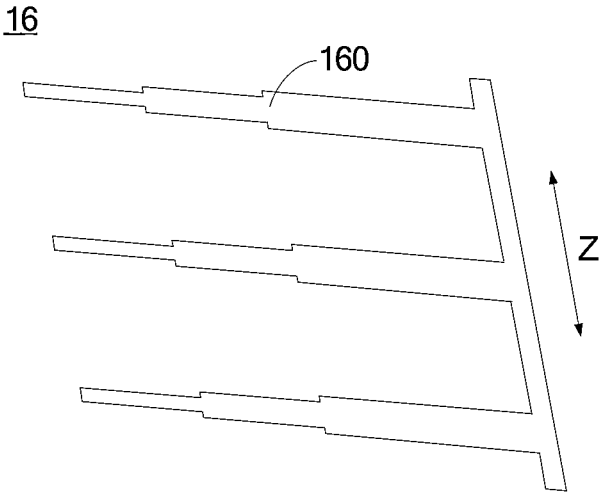
FIG. 14 is a structural schematic view of the second support member of FIG. 2 in some embodiments of the present disclosure.

In some embodiments, referring to FIG. 2 or FIG. 6, widths of the support strips 160 of the second support member 16 in the second direction Z are the same or equal to each other along a direction away from the body mechanism 10. In some embodiments, as shown in FIG. 13, FIG. 13 is a structural schematic view of the second support member of FIG. 2 in some embodiments of the present disclosure. The widths of the support strips 160 in the second direction Z gradually increase along the direction away from the body mechanism 10. As shown in FIG. 14, FIG. 14 is a structural schematic view of the second support member 16 of FIG. 2 in some embodiments of the present disclosure. The widths of the support strips 160 in the second direction Z sharply and stepwise increase along the direction away from the body mechanism 10, such that a plurality of steps are formed by the support strips 160. Generally speaking, the farther the flexible screen 2 is away from the body mechanism 10, the lower the strength of the flexible screen 2, and the higher the required support strength provided by the support assembly 1 for the flexible screen 2. The above two design modes may allow the support assembly 1 to provide higher support strength in the direction away from the body mechanism 10.

Referring to FIGS. 2 and 3, the support assembly 1 provided in some embodiments of the present disclosure may also include a rotating shaft 11. The rotating shaft 11 is located on a side of the rolling shaft 14 away from the body mechanism 10, and configured to limit the sliding of the flexible screen 2.

In some embodiments, the rotating shaft 11 is configured to be fixedly connected to an end of the flexible screen 2, so that the flexible screen 2 may be rolled on the rotating shaft 11. This design mode may make the rolling and unfolding process of flexible screen 2 easier. In some embodiments, the first support member 12 and the flexible screen 2 are arranged separately and independently. The flexible screen 2 is rolled and stored on the rotating shaft 11, and the first support member 12 is rolled and stored on the rolling shaft 14. During the rolling and storage process, the first support member 12 will not squeeze or press the flexible screen 2, reducing the probability of damage to the flexible screen 2 during the rolling process.

In some embodiments, the rotating shaft 11 and the rolling shaft 14 are parallel to each other, and the rotating shaft 11 may be fixedly connected to the translation mechanism 18.

In some embodiments, a thickness of the first support member 12 is greater than that of the flexible screen 2, and a radius of the rolling shaft 14 is smaller or less than that of the rotating shaft 11. This design mode may make the rolling radius of flexible screen 2 larger during the rolling process, thereby reducing a bending stress of flexible screen 2. In some embodiments, when the first support member 12 and the flexible screen 2 are fully rolled, a cylinder formed by the rolling shaft 14 and the first support member 12 located on a periphery of the rolling shaft 14 has a first radius. A cylinder formed by the rotating shaft 11 and the flexible screen 2 located on a periphery of the rotating shaft 11 has a second radius. The first radius is smaller or less than the second radius, and the difference between the first radius and the second radius is the thickness of the flexible screen 2, so that the display surface of the flexible screen 2 exposed after fully rolling is flat.

Some embodiments of the present disclosure also provide a display device. In some embodiments, as shown in FIGS. 2, 3, and 4, when the translation mechanism 18 moves away from the body mechanism 10 along the sliding direction X under an external force (i.e. when the display device is unfolded), the rotating shaft 11, the rolling shaft 14, and the second support member 16 follow the translation mechanism 18 to move away from the body mechanism 10 along the sliding direction X, because the rotating shaft 11, the rolling shaft 14, and the second support member 16 are fixedly connected to the translation mechanism 18. The flexible screen 2 rolled on the rotating shaft 11 is unfolded, and the first support member 12 rolled on the rolling shaft 14 is unfolded. The second support member 16 accommodated in the accommodate groove 1006 of the body mechanism 10 slides out of the accommodate groove 1006 and is stacked on the side of the first support member 12 away from the flexible screen 2. The first support member 12 and the second support member 16 may support the flexible screen 2 located on the outer side of the body mechanism 10.

In some embodiments, as shown in FIGS. 2, 3, and 4, when the translation mechanism 18 approaches the body mechanism 10 along the sliding direction X under the external force (i.e. when the display device is rolled), the rotating shaft 11, the rolling shaft 14, and the second support member 16 follow the translation mechanism 18 to approach the body mechanism 10 along the sliding direction X, because the rotating shaft 11, the rolling shaft 14, and the second support member 16 are fixedly connected to the translation mechanism 18. In this case, the flexible screen 2 located on the outer side of the body mechanism 10 and unfolded may be rolled on the rotating shaft 11. The first support member 12 located on the outer side of the body mechanism 10 and unfolded may be rolled on the rolling shaft 14. The second support member 16 sliding out of the accommodate groove 1006 may be slid into the accommodate groove 1006.

In some embodiments, as shown in FIGS. 5 and 6, when the translation mechanism 18 moves away from the body mechanism 10 along the sliding direction X under the external force (i.e. when the display device is unfolded), the rotating shaft 11 and the second support member 16 follow the translation mechanism 18 to move away from the body mechanism 10 along the sliding direction X, because the rotating shaft 11 and the second support member 16 are fixedly connected to the translation mechanism 18. Because the rolling shaft 14 is fixedly connected to the body mechanism 10, the rolling shaft 14 moves away from the translation mechanism 18 along the sliding direction X with the body mechanism 10. The flexible screen 2 rolled on the rotating shaft 11 is unfolded, and the first support member 12 rolled on the rolling shaft 14 is unfolded. The second support member 16 accommodated in the accommodate groove 1006 of the body mechanism 10 slides out of the accommodate groove 1006 and is stacked on the side of the first support member 12 away from the flexible screen 2. The first support member 12 and the second support member 16 may support the flexible screen 2 located on the outer side of the body mechanism 10.

In some embodiments, as shown in FIGS. 5 and 6, when the translation mechanism 18 approaches the body mechanism 10 along the sliding direction X under the external force (i.e. when the display device is rolled), the rotating shaft 11 and the second support member 16 follow the translation mechanism 18 to approach the body mechanism 10 along the sliding direction X, because the rotating shaft 11 and the second support member 16 are fixedly connected to the translation mechanism 18. Because the rolling shaft 14 is fixedly connected to the body mechanism 10, the rolling shaft 14 follow the body mechanism 10 to approach the translation mechanism 18 along the sliding direction X. The flexible screen 2 located on the outer side of the body mechanism 10 and unfolded may be rolled on the rotating shaft 11. The first support member 12 located on the outer side of the body mechanism 10 and unfolded may be rolled on the rolling shaft 14. The second support member 16 sliding out of the accommodate groove 1006 may be slid into the accommodate groove 1006.

Figure 15:
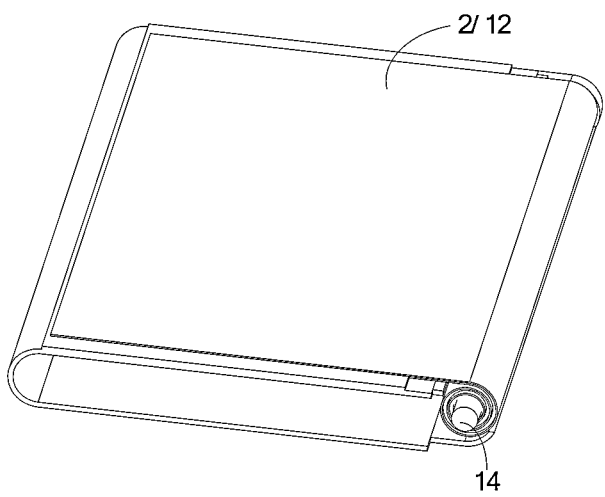
FIG. 15 is a structural schematic view of the support assembly and the flexible screen in some embodiments of the present disclosure.

In some embodiments, the flexible screen 2 and the first support member 12 are separately and independently rolled. In some embodiments, as shown in FIG. 15, FIG. 15 is a structural schematic view of the support assembly 1 and the flexible screen 2 in some embodiments of the present disclosure. The first support member 12 is configured to fit with or be attached to the flexible screen 2. The rolling shaft 14 is configured to drive the flexible screen 2 and the first support member 12 to roll or unfold together.

Figure 16:
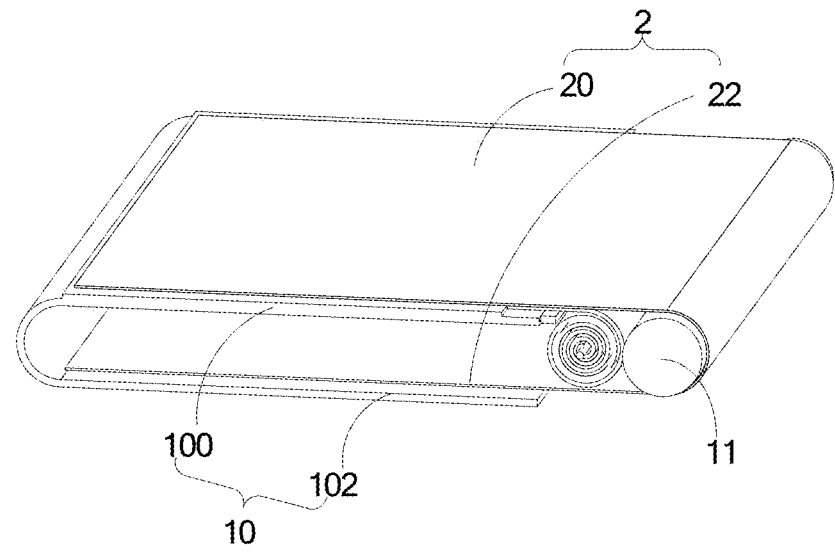
FIG. 16 is a structural schematic view of a display device in some embodiments of the present disclosure.
Figure 17:
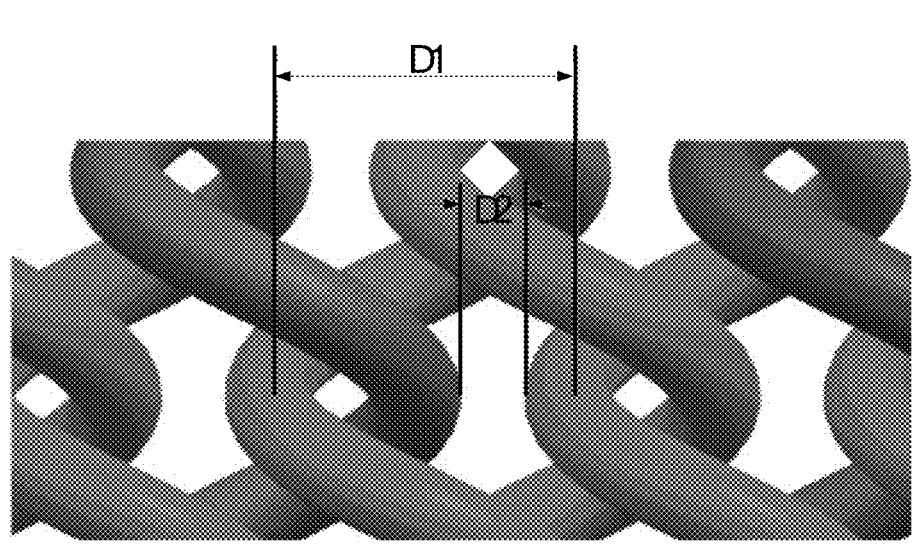
FIG. 17 is a structural schematic view of the display device of FIG. 16 when the display device is fully unfolded.

In some embodiments, the display device including the flexible screen 2 and the support assembly 1 is a rollable display device. In some embodiments, the flexible screen 2 and the support assembly 1 may also form a slidable display device. In some embodiments, as shown in FIGS. 16 and 17, FIG. 16 is a structural schematic view of a display device in some embodiments of the present disclosure. FIG. 17 is a structural schematic view of the display device of FIG. 16 when the display device is fully unfolded. The flexible screen 2 partially surrounds a side of the rotating shaft 11 away from the body mechanism 10 and slides along a circumferential direction of the rotating shaft 11. The flexible screen 2 located on the side of the first plate body 100 facing the second plate body 102 is accommodated in a non-rolling form. In some embodiments, as shown in FIG. 16, when the flexible screen 2 is not fully unfolded, the flexible screen 2 includes a first part 20 and a second part 22 connected to each other. The first part 20 is located on the first plate body 100 and may be fixedly connected to the first plate body 100. The other parts of the flexible screen 2 except the first part 20 form the second part 22. A sub-part of the second part 22 may be located between the first plate body 100 and the second plate body 102, and the sub-part of the second part 22 may be parallel to the first part 20. The second part 22 may slide away from the outer side of the body mechanism 10 along the rotating shaft 11 to roll or unfold.

The current mainstream flexible screen supports include perforated steel-sheet-type supports and watch-chain-type supports. Generally speaking, supporting and rolling properties of the perforated steel-sheet-type supports are related to their material properties, thickness, and density of holes. In order to achieve a small rolling radius, for the perforated steel-sheet-type supports, thicknesses will be inevitably reduced, apertures will be inevitably increased, and spacing between adjacent holes will be inevitably reduced. However, it will inevitably weaken the supporting property and damage the perforated steel-sheet-type supports. Besides, each perforated steel-sheet-type support is a whole piece structure, and an accumulated stress is large during rolling, which will cause a large gap between adjacent perforated steel-sheet-type supports. The watch-chain-type support includes multiple joints that are connected together through thin shafts. The rolling radius of the watch-chain-type support depends on lengths of the joints and rolling diameters of thin shafts. Due to the influence of structure and manufacturing process, it is impossible to achieve extremely small joint length and rolling diameter. Each of the joints is fixed by the thin shafts, thus the watch-chain-type support cannot move flexibly along a rolling direction of the flexible screen, and cannot roll together with the flexible screen.

Compared with the perforated steel sheet type supports and the watch-chain-type supports, the first support member of the support assembly provided in some embodiments of the present disclosure is a netlike structure formed by spiral flexible members. The connection of each spiral flexible member in the sliding direction X is very flexible, each flexible member may be rolled in the sliding direction X with a very small radius, and each spiral flexible member has a certain strength in the second direction Z. There is no locked fixed connection between two adjacent flexible members. The two adjacent of the flexible members are connected to each other only through a simple intersection. Thus, the first support member may flexibly move a small distance in the sliding direction X, to compensate for the displacement difference caused by being different from a neutral layer of the flexible screen during the rolling process. In some embodiments, the first support member and the flexible screen may be arranged side by side and rolled on different shafts. In some embodiments, the first support member may also be attached to the flexible screen and rolled on the same rolling shafts with the flexible screen, and the design mode is more flexible. In some embodiments, the second support member is arranged below the first support member. The second support member may provide a certain support strength for the first support member and the flexible screen disposed on or above the second support member. When the second support member has magnetism, the second support member may also adsorb the first support member disposed on or above the second support member, making the loose structure of the first and second support members to be tightly adhered to each other and further improving an overall strength of the first support member.

Figure 18:
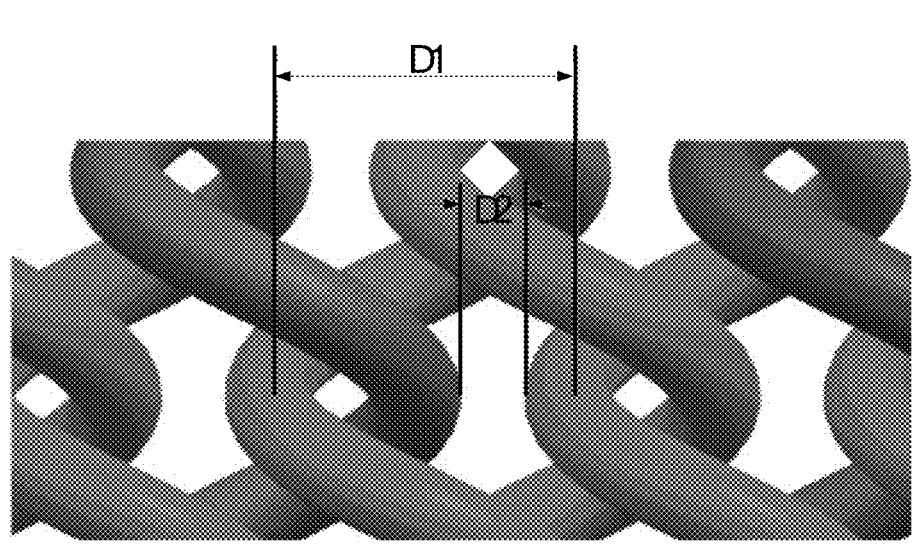
FIG. 18 is a partial schematic view of the first support member of FIG. 2 in some embodiments of the present disclosure.

In some embodiments, referring to FIG. 18, FIG. 18 is a partial schematic view of the first support member 12 of FIG. 2 in some embodiments of the present disclosure. A wire diameter of each of the flexible members of the first support member in some embodiments of the present disclosure is 0.3 mm. A diameter D1 of the spiral-shape structure formed by each of the flexible members is 1.2 mm. An aperture diameter D2 of the netlike structure of the first support member is 0.5 mm (i.e. 1.2−0.3*2−0.1, and a gap at the intersection is 0.1). A rolling radius of the first support member is half of a diameter of the spiral-shape structure (i.e. 0.6 mm). When the first supporting member independently supports the flexible screen 2, a support force born by the first supporting member is 3N in a deformation range of 1 mm. When the first support member and the second support member cooperatively support the flexible screen 2, and a distance between adjacent support strips of the second support member is 50 mm, the aperture diameter of the netlike structure of the first support member is reduced to 0.1 mm; and within the deformation range of 1 mm, the support force born by an area of the first support member which is not supported by the support strips is 8N.

In some embodiments, the perforated steel-sheet-type support has an aperture diameter of 0.5 mm, a hole spacing of 0.5 mm, a thickness of 0.05 mm, and a rolling radius of 1 mm. Within a deformation range of 1 mm, the support force born by the perforated steel-sheet-type support is 0.5N. When the second support member is disposed on a side of the perforated steel-sheet-type support, and the distance between adjacent support strips of the second support member is 50 mm, the support force born by an area of the perforated steel-sheet-type support which is not supported by the support strips is 2N.

According to the above comparison, it may be found that compared with existing perforated steel-sheet-type support, the first support member provided in some embodiments of the present disclosure has a smaller rolling radius and may improve the support force when unfolding the first support member.

Different from the existing technologies, the effects of the present disclosure are as follows. The support assembly provided in the present disclosure is configured to support the flexible screen. The support assembly includes the body mechanism and the first support member. The first surface of the body mechanism is configured to support a part of the flexible screen. The first support member is configured to support another part of the flexible screen which extends out of the first surface. The first support member is configured to provide strong support for the flexible screen, especially when users touch the flexible screen. In a sliding direction of the first support member, the first support member includes multiple flexible members disposed side by side, and two adjacent flexible members are connected to each other to form a netlike structure. This design mode may improve the flexibility of the first support member in the sliding direction. During subsequent rolling of the flexible screen, the first support member may be rolled with a smaller radius in the sliding direction, to reduce a volume occupied by the first support member, which facilitates to make the display device light and thin.

The above description is only some embodiments of the present disclosure, and is not intended to limit the scope of the present disclosure. Any equivalent structure or equivalent flow transformation made by using the contents of the specification and accompanying drawings of the present disclosure, or directly or indirectly applied to other related technical fields, is included in the scope of the patent protection of the present disclosure.

What is claimed is:

1. A support assembly configured to support a flexible screen, comprising:

a body mechanism, wherein a first surface of the body mechanism is configured to support a part of the flexible screen, and the body mechanism defines an accommodate groove, an extending direction of the accommodate groove is parallel to the sliding direction, and at least a part of the second support member is located in the accommodate groove and slidably connected to the accommodate groove;

a first support member, wherein at least a part of the first support member is arranged side by side with the body mechanism, and configured to support another part of the flexible screen which extends out of the first surface; the first support member comprises a first end and a second end disposed along a length direction of the first support member, the first end is fixed relative to the body mechanism, and the second end is configured to slide along a direction close to or away from the body mechanism and the first end is configured to remain fixed during the sliding operation; and in a sliding direction, the first support member comprises a plurality of flexible members disposed side by side, and two adjacent of the plurality of flexible members are connected to each other to form a netlike structure; and a second support member, wherein flexibility of the second support member is less than flexibility of the first support member, the second support member is stacked on a side of the first support member away from the flexible screen when the first support member supports the flexible screen, and the second support member and the first support member are configured to jointly support the flexible screen; and wherein the second support member is slidably connected to the body mechanism, and a sliding direction of the second end relative to the body mechanism is the same as a sliding direction of the second support member relative to the body mechanism;

wherein in the sliding direction, a step part is disposed on an edge of the first surface of the body mechanism adjacent to the first support member; the body mechanism comprises a first plate body, the first plate body comprises the first surface and a second surface opposite to each other; in a first direction directed from the first surface to the second surface, the step part comprises a bottom, the bottom defines a hollow area, the accommodate groove extends to the hollow area, and a side of the second support member facing the first surface is flush with the bottom.

2. The support assembly as claimed in claim 1, further comprising a translation mechanism, wherein the second end and the second support member simultaneously approach or move away from the body mechanism along the sliding direction; and wherein the translation mechanism is slidably connected to the body mechanism; and in the sliding direction, the second support member comprises a fixed end, and the second end and the fixed end are fixed relative to the translation mechanism.

3. The support assembly as claimed in claim 2, further comprising a rolling shaft configured to roll the first support member, wherein one of the first end and the second end is fixedly connected to the rolling shaft; and the first support member is configured to be attached to the flexible screen, and at least a part of the flexible screen and at least a part of the first support member are rolled on the rolling shaft.

4. The support assembly as claimed in claim 3, wherein the first end is fixedly disposed on the body mechanism, the second end is fixedly disposed on the rolling shaft, and the rolling shaft is configured to approach or move away from the body mechanism along the sliding direction.

5. The support assembly as claimed in claim 4, wherein the rolling shaft is fixedly disposed on the translation mechanism and located on a side of the fixed end away from the body mechanism;

the first end of the first support member is located on the step part and fixedly connected to the step part; and in the first direction directed from the first surface to the second surface, a thickness of the first support member is the same as a height of the step part.

6. The support assembly as claimed in claim 3, wherein the first end is fixedly disposed on the rolling shaft, the rolling shaft is fixed relative to the body mechanism, and the second end is configured to approach or move away from the body mechanism along the sliding direction.

7. The support assembly as claimed in claim 6, wherein the second end is fixedly disposed on the translation mechanism and located on a side of the fixed end away from the body mechanism; and the rolling shaft is located on an inner side of the body mechanism, the body mechanism comprises a hollow part, and the first end of the first support member passes through the hollow part and is fixedly connected to the rolling shaft.

8. The support assembly as claimed in claim 3, further comprising a rotating shaft located on a side of the rolling shaft away from the body mechanism, wherein the rotating shaft is configured to limit sliding of the flexible screen.

9. The support assembly as claimed in claim 8, wherein the thickness of the first support member is greater than a thickness of the flexible screen, and a radius of the rolling shaft is smaller than a radius of the rotating shaft.

10. The support assembly as claimed in claim 1, wherein the flexibility of the first support member in the sliding direction is greater than the flexibility of the first support member in a second direction, and the second direction is perpendicular to the sliding direction.

11. The support assembly as claimed in claim 10, wherein in the second direction, each of the plurality of flexible members extends in a spiral-shape structure;

ends of two adjacent of the plurality of flexible members intersect with each other;

in the sliding direction, the two adjacent of the plurality of flexible members are misaligned and intersect with each other to form the netlike structure; and each of the flexible members comprises convex parts and concave parts disposed alternately with each other, and top ends of the convex parts of each of the plurality of flexible members intersect with bottom ends of concave parts of an adjacent one of the plurality of flexible members.

12. The support assembly as claimed in claim 10, wherein the first support member comprises a plurality of connecting members disposed side by side with the plurality of flexible members, and two adjacent flexible members are connected by a corresponding one of the plurality of connecting member; in the sliding direction, all the flexible members are aligned with each other; and each of the plurality of flexible members comprises convex parts and concave parts disposed alternately with each other, top ends of the convex parts of one of the two adjacent flexible members intersect with a corresponding one of the plurality of connecting members located between the two adjacent flexible members, and bottom ends of the concave parts of the other of the two adjacent flexible members intersect with the corresponding one of the plurality of connecting members located between the two adjacent flexible members.

13. The support assembly as claimed in claim 10, wherein the second support member comprises:

a plurality of support strips, arranged side by side in the second direction; and a connecting strip, extending along the second direction and fixedly connected to each of the plurality of support strips.

14. The support assembly as claimed in claim 13, wherein the connecting strip is fixedly connected to an end of each of the plurality of support strips away from the body mechanism;

the second support member is a magnet and configured to attract the first support member;

when the first support member and the second support member are unfolded, the first support member comprises a first and a second part disposed alternately with each other; an orthogonal projection of the first part on the second support member coincides with the plurality of support strips, and an orthogonal projection of the second part on the second support member is staggered with the plurality of support strips; and an aperture diameter of the netlike structure of the first part is greater than an aperture diameter of the netlike structure of the second part;

each of the plurality of support strips is retractable and comprises a plurality of support parts that are slidably connected in sequence, and one of the plurality of support parts is fixedly connected to the translation mechanism;

outer surfaces of two adjacent of the plurality of support parts located on the same support strip are slidably connected to each other; or one of the two adjacent of plurality of support parts located on the same support strip defines an accommodate space, and an outer surface of the other of the two adjacent support parts is slidably connected to an inner surface of the accommodate space; and in a direction away from the body mechanism, widths of the plurality of support strips gradually increase in the second direction, or widths of the plurality of support strips sharply and stepwise increase in the second direction.

15. The support assembly as claimed in claim 1, further comprising a translation mechanism, wherein in a direction perpendicular to the first surface, the body mechanism further comprises a second plate body that is opposite to and spaced apart from the first body plate; and the translation mechanism comprises at least one extension plate body located between the first plate body and the second plate body, and the at least one extension plate body is slidably connected to the first plate body and the second plate body.

16. The support assembly as claimed in claim 15, wherein in a second direction perpendicular to the sliding direction, the translation mechanism comprises two extension plate bodies that are opposite to and spaced apart from each other.

17. A display device, comprising:

a flexible screen; and a support assembly configured to support the flexible screen, wherein the support assembly comprises:
  a body mechanism, wherein a first surface of the body mechanism is configured to support a part of the flexible screen;
a first support member, wherein at least a part of the first support member is arranged side by side with the body mechanism, and configured to support another part of the flexible screen which extends out of the first surface; the first support member comprises a first end and a second end disposed along a length direction of the first support member, the first end is fixed relative to the body mechanism, and the second end is configured to slide along a direction close to or away from the body mechanism and the first end is configured to remain fixed during the sliding operation; and in a sliding direction, the first support member comprises a plurality of flexible members disposed side by side, and two adjacent of the plurality of flexible members are connected to each other to form a netlike structure;
  a second support member,
    wherein flexibility of the second support member is less than flexibility of the first support member, the second support member is stacked on a side of the first support member away from the flexible screen when the first support member supports the flexible screen, and the second support member and the first support member are configured to jointly support the flexible screen;
    wherein the second support member is slidably connected to the body mechanism, and a sliding direction of the second end relative to the body mechanism is the same as a sliding direction of the second support member relative to the body mechanism; translation mechanism, wherein the second end and the second support member simultaneously approach or move away from the body mechanism along the sliding direction; and
  wherein the translation mechanism is slidably connected to the body mechanism; and in the sliding direction, the second support member comprises a fixed end, and the second end and the fixed end are fixed relative to the translation mechanism; and
a rolling shaft, configured to roll the first support member, wherein one of the first end and the second end is fixedly connected to the rolling shaft; and
  the first support member is configured to be attached to the flexible screen, and at least a part of the flexible screen and at least a part of the first support member are rolled on the rolling shaft;
wherein the first end is fixedly disposed on the body mechanism, the second end is fixedly disposed on the rolling shaft, and the rolling shaft is configured to approach or move away from the body mechanism along the sliding direction;
wherein the rolling shaft is fixedly disposed on the translation mechanism and located on a side of the fixed end away from the body mechanism;
in the sliding direction, a step part is disposed on an edge of the first surface of the body mechanism adjacent to the first support member, and the first end of the first support member is located on the step part and fixedly connected to the step part; and
the body mechanism comprises a first plate body, and the first plate body comprises the first surface and a second surface opposite to the first surface; in a first direction directed from the first surface to the second surface, a thickness of the first support member is the same as a height of the step part.

* * * * *